United States Patent
Gubser et al.

(10) Patent No.: US 6,185,810 B1
(45) Date of Patent: Feb. 13, 2001

(54) METHOD OF MAKING HIGH TEMPERATURE SUPERCONDUCTING CERAMIC OXIDE COMPOSITE WITH RETICULATED METAL FOAM

(75) Inventors: Donald U. Gubser, Fairfax; M. Ashraf Imam, Great Falls, both of VA (US)

(73) Assignee: The United States of America as represented by the Secretary of the Navy, Washington, DC (US)

( * ) Notice: Under 35 U.S.C. 154(b), the term of this patent shall be extended for 0 days.

(21) Appl. No.: 08/877,880

(22) Filed: Jun. 18, 1997

(51) Int. Cl.[7] .................................................. H01L 39/24
(52) U.S. Cl. ............................ 29/599; 505/230; 505/430
(58) Field of Search ............................... 29/599; 505/230, 505/232, 236, 237, 430, 433; 428/545, 539.5

(56) References Cited

U.S. PATENT DOCUMENTS

| | | | |
|---|---|---|---|
| 4,235,277 | * 11/1980 | Aizawa et al. | 164/36 |
| 4,849,288 | 7/1989 | Schmaderer et al. | 428/366 |
| 4,929,596 | 5/1990 | Meyer et al. | 505/1 |
| 4,980,964 | 1/1991 | Boeke | 29/599 |
| 4,983,574 | 1/1991 | Meyer | 505/1 |
| 5,017,553 | 5/1991 | Whitlow et al. | 505/1 |
| 5,075,286 | * 12/1991 | Powell et al. | 29/599 X |
| 5,082,826 | 1/1992 | Ferrando | 505/1 |
| 5,110,789 | * 5/1992 | Yamaguchi et al. | 505/230 |
| 5,206,211 | 4/1993 | Meyer | 505/1 |
| 5,248,661 | * 9/1993 | Mole et al. | 505/230 |
| 5,262,398 | * 11/1993 | Nagata et al. | 505/452 |
| 5,306,704 | 4/1994 | Gleixner et al. | 505/425 |
| 5,347,085 | 9/1994 | Kikuchi et al. | 505/231 |
| 5,374,612 | 12/1994 | Ito et al. | 505/232 |
| 5,455,225 | * 10/1995 | Duperray et al. | 505/490 |
| 5,470,871 | 11/1995 | Wong et al. | 505/236 |
| 5,501,746 | * 3/1996 | Egawa et al. | 29/599 X |
| 5,557,072 | 9/1996 | Verhaege et al. | 174/125.1 |

OTHER PUBLICATIONS

Gubser D.U., "Superconducting Homopolar Motor and Conductor Development" JOM 48(10) (1996) pp 30–34 at p. 33.

* cited by examiner

*Primary Examiner*—David P. Bryant
(74) *Attorney, Agent, or Firm*—Barry A. Edelberg; Ralph T. Webb

(57) ABSTRACT

A high temperature superconducting composite rod, wire or tape is formed by filling the open cells of a reticulated foam structure made of silver, silver alloy, gold or gold alloy with a superconducting ceramic oxide or precursor, compacting the filled structure and forming it into a rod, wire or tape and heating it to melt and/or texture the superconducting ceramic oxide. The resulting composite has continuous ligaments of metal throughout a continuous region of superconducting ceramic oxide.

17 Claims, 2 Drawing Sheets

METHOD OF MAKING HIGH TEMPERATURE SUPERCONDUCTING CERAMIC OXIDE COMPOSITE WITH RETICULATED METAL FOAM

BACKGROUND OF THE INVENTION

1. Field of the Invention

The invention relates to high temperature superconducting composite materials, and more particularly to a high temperature superconducting composite material made by filling the open cells of a silver, silver alloy, gold or gold alloy foam with a high temperature superconducting ceramic oxide.

2. Description of the Related Art

Superconducting ceramic oxides with critical temperatures that exceed the temperature of liquid nitrogen have been developed in recent years. However, the full potential of these materials for transporting power or generating magnetic fields has not been realized because the ceramic oxides are hard, brittle and difficult to form in proper geometries (wires, rods or tapes) with the requisite composition and structural orientation.

Superconducting rods, wires or tapes may be fabricated by packing the ceramic oxide powder into a metal tube and then drawing the tube into a wire or rod or flattening it into a tape. Methods of making single strand conductors are disclosed in U.S. Pat. No. 4,980,964 to Boeke and U.S. Pat. No. 5,206,211 to Meyer. To create a multifilamentary conductor for use in magnets, the wire can be rebundled and then redrawn or rolled into a tape. A method of fabricating superconducting ceramic tape is to coat the ceramic onto one or both sides of a metal tape. Various other geometric configurations for superconducting wire with multiple filaments are disclosed in U.S. Pat. No. 4,929,596 to Meyer et al, U.S. Pat. No. 4,849,288 to Schmaderer et al, U.S. Pat. No. 5,374,612 to Ito et al, U.S. Pat. No. 5,017,553 to Whitlow et al and U.S. Pat. No. 5,347,085 to Kikuchi et al. Conductors as described above are limited in their current carrying capacity because individual superconducting filaments are subject to material inhomogeneities.

Other approaches to reinforcing superconducting ceramics, making them stronger and easier to fabricate, are to disperse metal particles throughout a superconducting matrix or to disperse superconducting ceramic particles throughout a metal matrix. U.S. Pat. No. 5,082,826 to Ferrando discloses a superconducting ceramic powder in which powder particles are coated with silver. U.S. Pat. No. 4,983,574 to Meyer describes a conductor having particles of ceramic sintered high-temperature superconductor embedded in a metal matrix. U.S. Pat. No. 5,306,704 to Gleixner et al discloses a method of dispersing a metal homogeneously throughout a superconducting material by blending the metal and a superconducting oxide, melting the blend and blowing the blend to form glasseous filaments. Superconducting materials as described above contain either discontinuous ceramic oxide particles or discontinuous metal particles. The dispersion of metal throughout a ceramic matrix or the dispersion of ceramic throughout a metal matrix provides improved strength and flexibility, but results in poorer superconducting properties and thermal stability. U.S. Pat. No. 5,470,821 to Wong et al describes a bulk composite superconducting material made by combining ceramic oxide and metallic particulates. The composite is compressed so that the metallic material fills the interstices between the ceramic oxide particles.

SUMMARY OF THE INVENTION

It is an object of the invention to provide a high temperature superconducting ceramic oxide composite with a high current carrying capacity.

It is a further object of the invention to provide a high temperature superconducting ceramic oxide composite that is mechanically strong.

It is a further object of the invention to provide a high temperature superconducting ceramic oxide composite that has a large interface area with silver, silver alloy, gold or gold alloy uniformly spaced throughout the composite.

It is a further object of the invention to provide a high temperature superconducting ceramic oxide composite that allows for rapid and uniform oxygenation of the superconducting ceramic oxide.

It is a further object of the invention to provide a high temperature superconducting ceramic oxide composite that provides high thermal conductivity to minimize the development of hot spots during operation as a superconductor.

It is a further object of the invention to provide a high temperature superconducting ceramic oxide composite that is easy and inexpensive to fabricate.

These and other objects are accomplished by a method of making a high temperature superconducting composite comprising the steps of providing a reticulated foam structure made of a metal selected from the group consisting of silver, silver alloy, gold and gold alloy, the reticulated foam structure having continuous ligaments defining a plurality of continuous open cells, filling the continuous open cells of the reticulated foam structure with a high temperature superconducting ceramic oxide or precursor, compacting the filled structure, and heating the compacted structure to melt and/or texture the high temperature superconducting ceramic oxide or precursor to form a continuous region of high temperature superconducting ceramic oxide throughout the compacted reticulated foam structure. Making a composite by the method outlined above results in a composite that is mechanically strong, and has a large interface area between the superconducting ceramic oxide and the metal, which allows a uniform current flow and a high current density. Since oxygen diffuses more rapidly through the metals listed above than it does through a ceramic oxide, the large interface area allows for more rapid and more homogeneous oxygenation. Because the metals are more thermally conductive than ceramic oxide, the thermal stability of the superconducting ceramic oxide is enhanced.

DETAILED DESCRIPTION OF THE PREFERRED EMBODIMENTS

Figure 1:
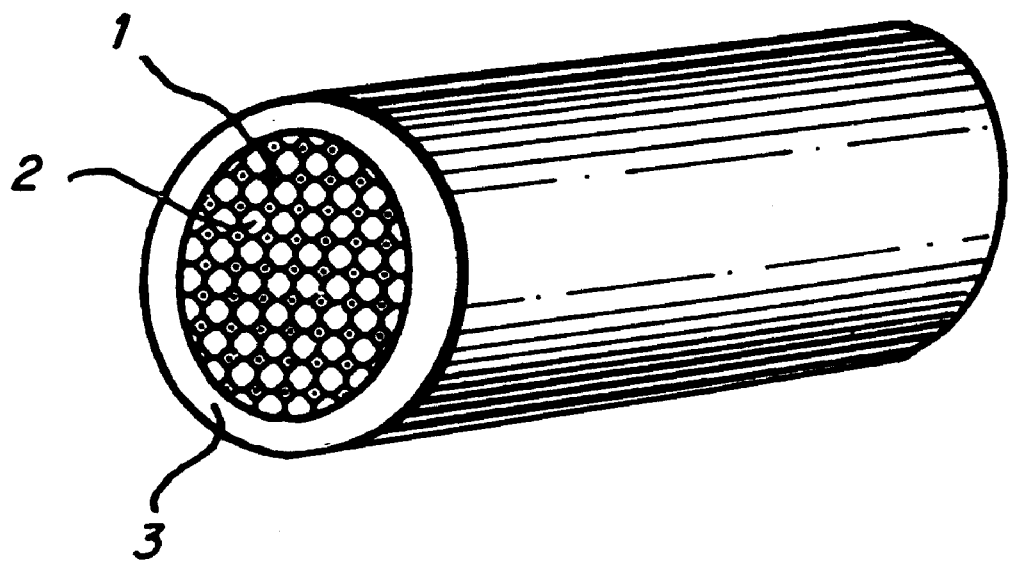
FIG. 1 is an diagrammatic, perspective view partly in section of a superconducting wire of the present invention.

The present invention is a method of making a high temperature superconducting ceramic oxide composite by filling the open cells of a reticulated silver, silver alloy, gold or gold alloy foam structure with a superconducting ceramic oxide or precursor and then compacting and heating the structure to make a composite that has a continuous region of high temperature superconducting ceramic oxide interlaced throughout the compacted reticulated metal foam.

The reticulated foam structure can be any structure that has a plurality of continuous cross-linked ligaments or filaments that define a plurality of continuously connected open cells that can be filled with a superconducting ceramic oxide. As used herein, the term "open cells" refers to the open spaces between or among cross-linked ligaments or filaments. The criterion for selecting a preferred reticulated foam structure for the invention is to provide a structure that, when the open spaces are filled with a superconducting material, will have a large interface area between the structural material (the metal foam) and the superconducting material (the ceramic oxide) while providing both continuous ligaments of the structural material and a continuous region of superconducting material. While the invention is not limited to these embodiments, examples of reticulated foam structures having suitable geometry for the practice of the invention are described in U.S. Pat. No. 3,616,841 to Walz and U.S. Pat. No. 3,946,039 to Walz, and U.S. Pat. No. 4,235,277 to Aizawa, the disclosures of which are hereby incorporated by reference. Also, reticulated foam materials are fabricated by Energy Research and Generation, Inc. of Oakland, Calif. under the trademark Duocel®.

Reticulated foam structures are typically defined in terms of the relative density of the foam structure as compared to the density of the bulk material of the same composition. Preferably, the reticulated foam structure of the present invention (before filling with the superconducting ceramic oxide) will have a relative density of from about 5% to about 55% of that of the bulk material. Most preferably, the reticulated foam structure will have a relative density of from about 10% to about 30% of that of the bulk material. Another typical way of defining the geometry of a foam structure is in terms of pores per inch. Preferably, the reticulated foam structure of the present invention will have from about 5 to about 80 pores per inch.

The reticulated foam structure is preferably made of silver, silver alloy, gold or gold alloy. Because the preparation of the superconducting composite requires a heating step to melt and/or texture the superconducting ceramic or precursor at a temperature, which, for particular ceramic oxides, may be above the melting temperature of pure silver, it is preferred that a silver alloy selected to have a melting temperature above the melting and/or texturing temperature of the particular ceramic oxide be used in the practice of the invention. Preferably, the silver alloy is a silver-palladium alloy that is at least 80% silver, more preferably at least 90% silver by weight.

Any high temperature superconducting ceramic oxide may be used in the practice of the invention. A high temperature superconducting ceramic oxide is typically defined as a ceramic oxide superconductor that has an onset or critical temperature ($T_c$) above the temperature of liquid nitrogen. Preferably, the high temperature superconducting ceramic oxide is selected from the group consisting of bismuth-based superconducting ceramic oxides, thallium-based superconducting ceramic oxides, yttrium-based superconducting ceramic oxides, and mercury-based superconducting ceramic oxides. Most preferably, the high temperature superconducting ceramic oxide is selected from the group consisting of $Bi_2Sr_2Ca_1Cu_2O_y$(BSCCO), $Bi_2Sr_2Ca_2Cu_3O_y$, $Y_1Ba_2Cu_3O_y$(YBCO), $Tl_2Ba_2Ca_2Cu_3O_y$, $Tl_1Ba_2Ca_2Cu_3O_y$, $Hg_1Ba_2Ca_2Cu_3O_y$, and $Hg_1Ba_2Ca_1Cu_2O_y$. In each of the above formulas, y represents the relative oxygen content in the range appropriate for the particular superconducting ceramic oxide. Alternatively, precursors of superconducting ceramic oxides can be used. Precursors are mixtures of oxides that collectively have the same nominal composition as a superconducting ceramic oxide and which form a superconducting ceramic oxide upon heating. The superconducting ceramic oxide or precursor used in the method of the invention is initially in the form of a powder or slurry so that it can fill the open spaces in the reticulated foam structure. The superconducting ceramic oxide or precursor is formed into a powder or slurry by any conventional means.

The high temperature superconducting ceramic oxide composite of the present invention is formed by filling the open spaces of the reticulated foam structure with a superconducting ceramic oxide or precursor, compacting the filled structure and then heating the compacted structure to melt and/or texture the ceramic oxide or precursor. These steps can be conducted in any manner.

The temperature for the heating step depends on the melting and/or texturing temperature of the particular ceramic oxide. When a superconducting ceramic oxide is used in the method of the invention, the heating step serves to solidify and texture the superconducting ceramic oxide to form a continuous region of the superconducting ceramic oxide throughout the structure and to optimize the superconducting properties. Texturing is enhanced at the metal/superconductor interface; therefore, the extensive interfaces provided by this invention will promote texturing. Texturing occurs during the solidification process if the ceramic oxide material is melted. When a precursor is used, the heating step also serves to effect the conversion of the precursor to the superconducting ceramic oxide and then to solidify and texture the newly formed superconducting ceramic oxide. Temperatures used in the melting and texturing of superconducting ceramic oxides are typically in the range of 800° C. to 1100° C.

The reticulated foam structure should be enclosed in a sheath before the step of filling the continuous open cells of the reticulated foam structure with the high temperature superconducting ceramic oxide or precursor to avoid the leakage and spillage of the material during the filling and compacting steps. The sheath may be of any form and made of any material suitable for enclosing the reticulated foam structure to prevent leakage and spillage and for being compacted. Preferably, the sheath is a tubular material having the same chemical composition as the reticulated foam structure.

The method of the present invention is particularly well-suited for forming superconducting composite conductors, particularly wires, rods, or tapes. To form a superconducting wire, rod or tape, the reticulated foam structure is placed inside a sheath, which is preferably a hollow cylinder such as a tube or pipe of a suitable size to fit around the reticulated foam structure. Preferably, the reticulated foam structure is in the shape of a cylinder that has an outer diameter that is approximately equal to the inner diameter of the sheath so that the reticulated foam structure fits snugly into the sheath. The sheath should be closed on one end to prevent leakage of the superconducting ceramic oxide or precursor during the filling step and should have an open end through which the reticulated foam structure is filled with the superconducting ceramic oxide or precursor. After the open cells of the reticulated foam structure are filled, the sheath is closed or sealed. The sheath may then be formed into a rod or wire by reducing the outer diameter of the sheath by any conventional means such as by drawing, swaging or extruding. The sheath may be formed into a tape by any conventional means of flattening. Forming the sheath into a wire, rod or tape also serves to compact the enclosed reticulated foam structure and the superconducting ceramic oxide or precursor contained therein. The wire, rod or tape is then heated to texture the superconducting ceramic oxide or, when ceramic oxide precursors are used, to synthesize, melt and texture the corresponding superconducting ceramic oxide so that a continuous region of high temperature superconducting ceramic oxide is formed throughout the compacted reticulated foam structure. Shown diagrammatically in FIG. 1 is a cross section of a superconducting wire made according to the process of the present invention, including the compacted reticulated foam structure 1, the high temperature superconducting ceramic oxide 2, and the surrounding sheath 3.

Figure 2:
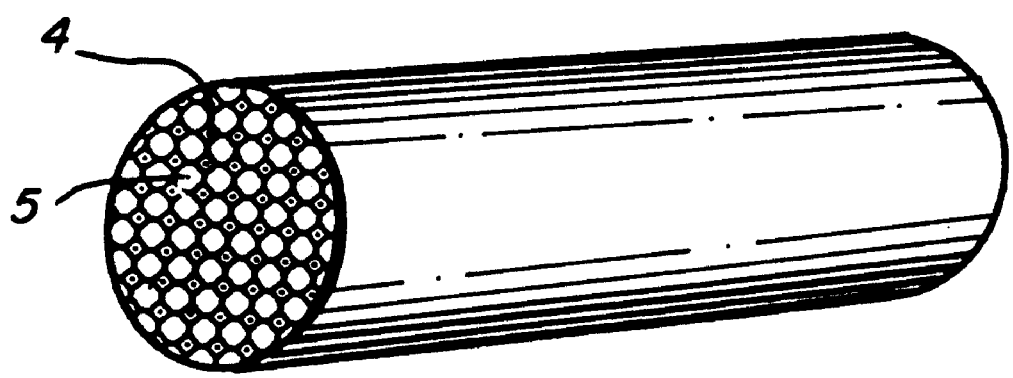
FIG. 2 is a diagrammatic, perspective view partly in section of a second embodiment of a superconducting wire of the present invention.

In instances where it is desired to minimize thermal conduction along the composite, the sheath may be removed by any conventional means. Shown diagrammatically in FIG. 2 is a cross section of a superconducting wire wherein the sheath has been removed, including the compacted reticulated foam structure 4 and the high temperature superconducting ceramic oxide 5.

The preparation of a superconducting ceramic oxide composite may also include a step of oxygenating the superconducting ceramic oxide to improve its superconducting properties.

The superconducting ceramic oxide composite or conductor of the present invention can be used in any application where transporting electricity or generating a magnetic field with minimal power loss is desired. The composite may be cooled below the temperature at which the material becomes superconducting by any conventional means, including by immersing it in liquid nitrogen, neon or helium, by convection cooling with a gas or by conductive cooling by attaching the composite to a cryocooler.

Having described the invention, the following examples are given to illustrate specific applications of the invention, including the best mode now known to perform the invention. The specific examples are not intended to limit the scope of the invention described in this application.

EXAMPLES

Example 1

Reticulated foam material of a silver-palladium alloy having about 90% silver and a pore size of 10 pores per inch was obtained from Energy Research and Generation, Inc., Oakland Calif. The material was cut into the shape of a cylinder having a diameter of 1.5 cm and placed tightly inside a copper tube that was sealed on one end. (Copper tubing was chosen only because of its low cost and availability for quickly constructing an experimental prototype; the preferred material for the practice of the invention is a silver-palladium alloy as described in Example 2 below.) The tube was then filled with YBCO powder so that the YBCO powder filled the open cells of the reticulated foam material. The open end of the tube was capped shut and the tube was then swaged to form a wire. The copper sheath was then dissolved away by immersing the wire in nitric acid. The wire was then melt-textured by slowly passing it through a furnace with a peak temperature of 1050° C.

Figure 3:
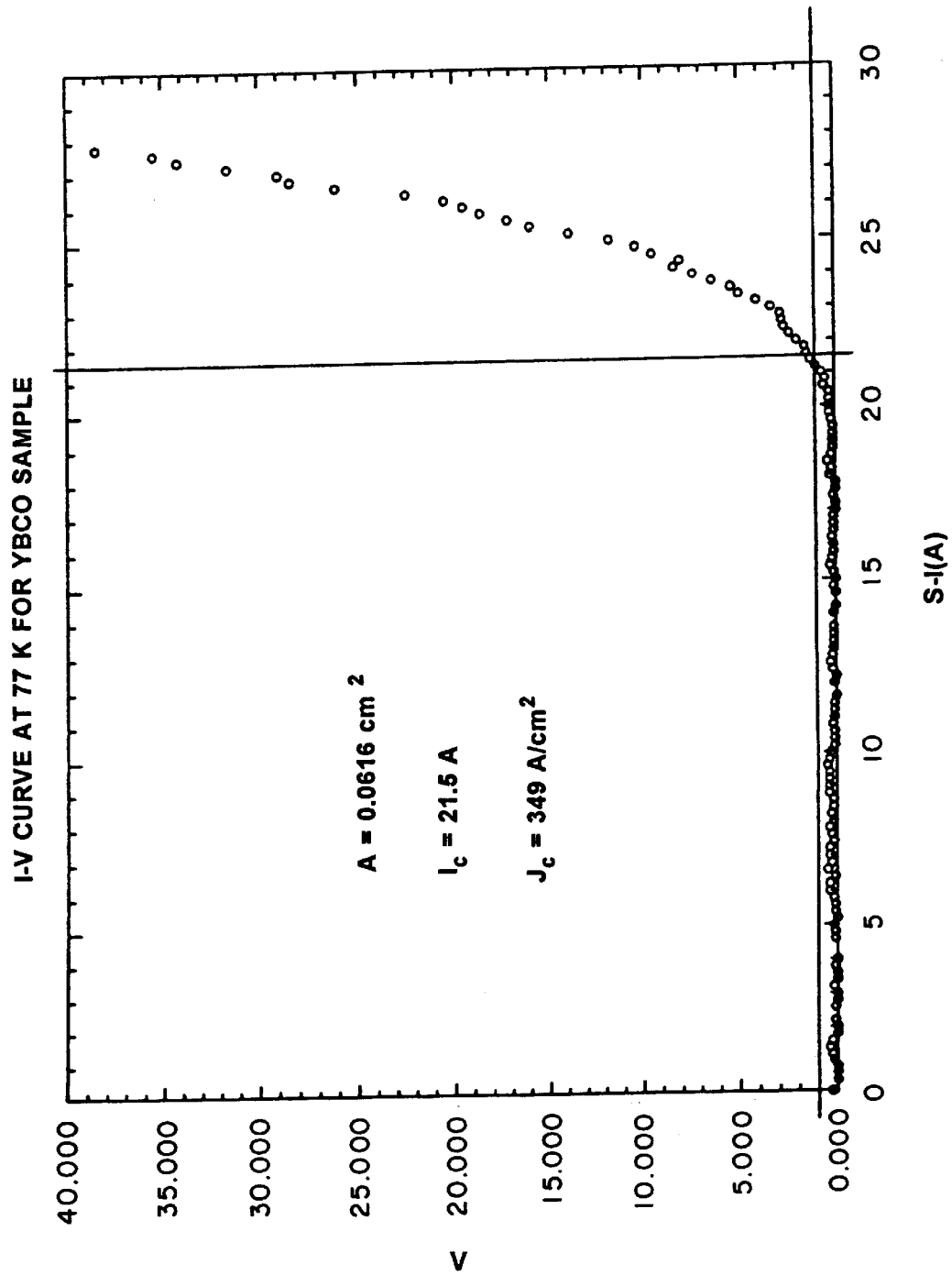
FIG. 3 is a plot of voltage, V vs. current, I, of a high temperature superconducting rod with a cross-sectional area of 0.0616 $cm^2$.

FIG. 3 shows a plot of voltage, V, vs. current, I, for a wire made as described above with a cross-sectional area of 0.0616 cm$^2$. The measurements were made at 77° K with a zero magnetic field. The plot shows a critical current, $I_c$ of 21.5A., which gives a current density, $J_c$ of 349 A/cm$^2$.

Example 2

Reticulated foam material of a silver-palladium alloy having about 90% silver and a pore size of 10 pores per inch is cut into the shape of a cylinder having a diameter of 1.5 cm and placed tightly inside a tube of silver-palladium alloy of the same composition. The tube is sealed on one end. The tube is then filled with YBCO powder. The open end of the tube is sealed. The tube is then swaged to form a wire. The wire is then melt-textured by slowly passing it through a furnace with a peak temperature of 1050° C.

Obviously, many modifications and variations of the present invention are possible in light of the above teachings. It is therefore to be understood that, within the scope of the appended claims, the invention may be practiced otherwise than as specifically described.

What is claimed is:

1. A method of making a high temperature superconducting composite comprising the steps of providing a reticulated foam structure comprising a metal selected from the group consisting of silver, silver alloy, gold and gold alloy, the reticulated foam structure having continuous ligaments defining a plurality of continuous open cells, filling the continuous open cells of the reticulated foam structure with a high temperature superconducting ceramic oxide or precursor, compacting the filled structure, and heating the compacted structure to melt and/or texture the high temperature superconducting ceramic oxide or precursor to form a continuous region of high temperature superconducting ceramic oxide throughout the compacted structure, wherein the metal is selected to have a higher melting temperature than the melt/texture temperature of the superconducting ceramic oxide or precursor.

2. A method of making a composite superconducting conductor comprising the steps of providing a reticulated foam structure made of a metal selected from the group consisting of silver, silver alloy, gold and gold alloy, the reticulated foam structure having continuous ligaments defining a plurality of continuous open cells, enclosing the reticulated foam structure in a sheath, filling the continuous open cells of the enclosed reticulated foam structure with a superconducting ceramic oxide or precursor, compacting the sheath, thereby compacting the enclosed filled reticulated foam structure, and heating the compacted sheath to melt and/or texture the compacted superconducting ceramic oxide or precursor to form a composite superconducting conductor having a continuous region of superconducting ceramic oxide throughout the enclosed, compacted reticulated foam structure, wherein the metal is selected to have a higher melting temperature than the melt/texture temperature of the superconducting ceramic oxide or precursor.

3. The method of claim 2, wherein the step of compacting the sheath involves forming the sheath into a wire.

4. The method of claim 2, wherein the step of compacting the sheath involves forming the sheath into a rod.

5. The method of claim 2, wherein the step of compacting the sheath involves forming the sheath into a tape.

6. The method of claim 2, wherein the reticulated foam structure is a silver-palladium alloy.

7. The method of claim 6, wherein the silver-palladium alloy comprises at least about 80% silver by weight.

8. The method of claim 6, wherein the silver-palladium alloy comprises at least about 90% silver by weight.

9. The method of claim 2, wherein the reticulated foam structure has a relative density of from about 5% to about 55% of that of bulk non-superconducting metal of the same composition.

10. The method of claim 2, wherein the reticulated foam structure has a relative density of from about 10% to about 30% of that of bulk metal of the same composition.

11. The method of claim 2, wherein the reticulated foam structure is characterized as having from about 5 to about 80 pores per inch.

12. The method of claim 2, wherein the high temperature superconducting ceramic oxide or precursor before the heating step is in the form of a powder.

13. The method of claim 2, wherein the high temperature superconducting ceramic oxide or precursor before the heating step is in the form of a slurry.

14. The method of claim 2, wherein the high temperature superconducting ceramic oxide is selected from the group consisting of bismuth-based superconducting ceramics, thallium-based superconducting ceramics, yttrium-based superconducting ceramics, and mercury-based superconducting ceramics.

15. The method of claim 2, wherein the high temperature superconducting ceramic oxide is selected from the group consisting of $Bi_2Sr_2Ca_1Cu_2O_y$, $Bi_2Sr_2Ca_2Cu_3O_y$, $Y_1Ba_2Cu_3O_y$, $Tl_2Ba_2Ca_2Cu_3O_y$, $Tl_1Ba_2Ca_2Cu_3O_y$, $Hg_1Ba_2Ca_2Cu_3O_y$ and $Hg_1Ba_2Ca_1Cu_2O_y$.

16. The method of claim 2, wherein the reticulated foam structure has a cylindrical shape, wherein the sheath is a tube having a sealed end, and wherein the outer diameter of the reticulated foam structure is approximately equal to the inner diameter of the tube.

17. The method of claim 2, wherein the sheath is made of a metal having the same composition as that of the reticulated foam structure.

* * * * *